US006798204B2

United States Patent
Seeber et al.

(10) Patent No.: US 6,798,204 B2
(45) Date of Patent: Sep. 28, 2004

(54) LOCAL RF MRI COIL USING METAL FOIL CONSTRUCTION ON A DOUBLE-SIDED SUBSTRATE WITH HOLES THAT DIRECTLY PASS DC CONDUCTORS

(75) Inventors: Derek Seeber, Wauwatosa, WI (US); Velibor Pikelja, Milwaukee, WI (US)

(73) Assignee: IGC - Medical Advances, Inc., Milwaukee, WI (US)

(*) Notice: Subject to any disclaimer, the term of this patent is extended or adjusted under 35 U.S.C. 154(b) by 44 days.

(21) Appl. No.: 10/268,339

(22) Filed: Oct. 9, 2002

(65) Prior Publication Data

US 2004/0070397 A1 Apr. 15, 2004

(51) Int. Cl.[7] ................................................ G01V 3/00
(52) U.S. Cl. ....................................... 324/318; 324/322
(58) Field of Search ................................ 324/300–322; 600/410, 423; 29/602

(56) References Cited

U.S. PATENT DOCUMENTS

| | | | | |
|---|---|---|---|---|
| 5,568,051 A | * | 10/1996 | Yamagata | 324/318 |
| 6,060,882 A | * | 5/2000 | Doty | 324/318 |
| 6,194,900 B1 | * | 2/2001 | Freeman et al. | 324/321 |
| 6,215,307 B1 | * | 4/2001 | Sementchenko | 324/318 |
| 6,259,251 B1 | * | 7/2001 | Sugiura et al. | 324/318 |
| 6,263,229 B1 | * | 7/2001 | Atalar et al. | 600/423 |
| 6,437,567 B1 | * | 8/2002 | Schenck et al. | 324/318 |
| 6,556,012 B2 | * | 4/2003 | Yamashita | 324/318 |
| 6,580,274 B2 | * | 6/2003 | Sato | 324/318 |
| 6,633,161 B1 | * | 10/2003 | Vaughan, Jr. | 324/318 |
| 2001/0022515 A1 | * | 9/2001 | Yamashita et al. | 324/300 |
| 2003/0107376 A1 | * | 6/2003 | Yasuhara | 324/318 |
| 2004/0070397 A1 | * | 4/2004 | Seeber et al. | 324/318 |

* cited by examiner

Primary Examiner—Diego Gutierrez
Assistant Examiner—Tiffany A. Fetzner
(74) Attorney, Agent, or Firm—Quarles & Brady LLP

(57) ABSTRACT

A local coil for magnetic resonance imaging equipment employs mirror conductors on opposite sides of an insulating substrate to produce lower resistance, higher Q and improved signal-to-noise ratio for a given foil thickness.

10 Claims, 2 Drawing Sheets

LOCAL RF MRI COIL USING METAL FOIL CONSTRUCTION ON A DOUBLE-SIDED SUBSTRATE WITH HOLES THAT DIRECTLY PASS DC CONDUCTORS

CROSS-REFERENCE TO RELATED APPLICATIONS

Statement Regarding Federally Sponsored Research or Development

Background of the Invention

The present invention relates to magnetic resonance imaging (MRI) and in particular to a method of manufacturing local coils used in MRI imaging.

Magnetic resonance imaging (MRI) reconstructs images, for example of the human body, by detecting a nuclear magnetic resonance (NMR) signal emitted from processing hydrogen protons, principally in watery tissue of the body. The NMR signal is faint and thus it is known in the art to place electrical coils on the patient in close proximity to the imaged tissue to improve the signal-to-noise ratio of the detected NMR signal.

A wide variety of different RF local coil designs are known in the art including single loop coils, paired loop coils (Helmholtz), quadrature coils, "bird cage" coils and phased array coils. Coils of these designs and others are shown generally in U.S. Pat. Nos. 4,734,647; 5,136,244; 5,166,618; 5,277,183; 5,370,118; 5,256,791 5,619,996; and 6,438,402, all assigned to the assignee of the present invention and hereby incorporated by reference.

The signal-to-noise ratio of the detected NMR signal may also be improved by reducing noise in the detected signal. To this end, local coils are usually tuned to a resonant frequency close to the expected Larmor frequency of the hydrogen protons whose resonance is being detected. For a 1.5 Tesla magnetic field in an MRI device, this frequency will be approximately 64 megahertz.

The tuning creates a sensitivity in the coil at the Larmor frequency of the expected NMR signal and a desensitivity to external noise sources at other frequencies. The sharpness of this frequency discrimination is a function of the electrical Q of the local coil which in turn is a function of the resistance of the coil conductors at the relevant NMR frequency.

Low resistance in the conductors of a local coil may be obtained by using conductors having large cross sections such as copper tubing. These conductors may be bent into the desired shape of the coil and tuned with series capacitances to the desired resonant frequency.

It can be difficult to manufacture coils using such conductors and the local coil that is produced is relatively rigid and may not readily conform to the patient. Accordingly, it is known in the art to construct local coils using printed circuit board material where the coils are precisely etched out of metal foil supported on an insulating substrate or formed using well-known additive techniques. The substrate may be flexible allowing the formed coils to better conform to the patient.

One disadvantage to the use of printed circuit board techniques is that the resistance of metal foil conductors is generally greater than the resistance of wire or tubular conductors. This higher resistance decreases the Q of the resultant local coil.

BRIEF SUMMARY OF THE INVENTION

The present inventors have found a way to significantly increase the Q of local coils manufactured of printed circuit board materials by forming duplicate patterns in metal foil on both sides of the insulating substrate. The duplicate patterns may, but need not be, joined with conductors. At high frequencies, the duplicate patterns share current flow decreasing the intrinsic resistance of the local coil. The proximity of the two patterns is also believed to promote more uniform current distribution in the metal foil decreasing the effective resistance of the foil. Alternatively, for a given desired Q, this technique allows thinner and more flexible metal foil to be used. Importantly, the inventors have determined that two separated layers of metal foil, of a given thickness, provide benefits beyond those obtained with a single layer of foil of twice the thickness. Further, the invention allows coil designs normally requiring foil layers thicker than is available in standard printed circuit boards, for example four ounce copper, to be realized using standard circuit board materials in which the copper foil is normally limited to two ounces or less.

Specifically, the present invention provides an MRI local coil in which a first conductive pattern is formed on a front surface of an insulating sheet to provide a resonant antenna sensitive to NMR signals. A second conductive pattern is formed on a rear surface of the insulating sheet in alignment with the first conductive pattern and, signal terminals are attached to the first conductive pattern to conduct an NMR signal to an MRI machine for processing.

Thus, it is one object of the invention to provide a method of significantly increasing the electrical Q of an MRI coil constructed using standard printed circuit materials and techniques.

The first and second conductive patterns may be substantially identical.

Another object of the invention is to provide a technique that may make use of existing patterns used for printed circuit board coils simply by duplicating the patterns on the rear surface of the printed circuit board.

The insulating sheet may be a flexible material.

Thus, it is another object of the invention to provide an improved tradeoff between improved flexibility of thin metal foil used in flexible local coils and high electrical Q.

The first and second conductive patterns may be electrically connected by direct current.

Thus, it is another object of the invention to allow improved control of current flow in the first and second patterns by defining points of common voltage.

The electrical connections between the first and second conductors may be via plate-through holes.

Thus, it is another object of the invention to permit an electrical interconnection between the patterns using standard printed circuit board techniques.

The first conductive pattern may include series capacitances to tune it into resonance and, the second conductive pattern may have corresponding series capacitances.

Thus, it is another object of the invention to allow distribution of the necessary tuning capacitances on both the first and second conductive patterns to employ lower value capacitances with higher electrical Q values.

The first and second conductive patterns may be loops.

Thus, it is an object of the invention to allow the manufacturer of a building block of many local coils using this technique.

The insulating sheet may be in the form of a cylindrical tube.

Thus, it is another object of the invention to allow the construction of coils having non-planar topologies.

DETAILED DESCRIPTION OF THE PREFERRED EMBODIMENT

Figure 1:
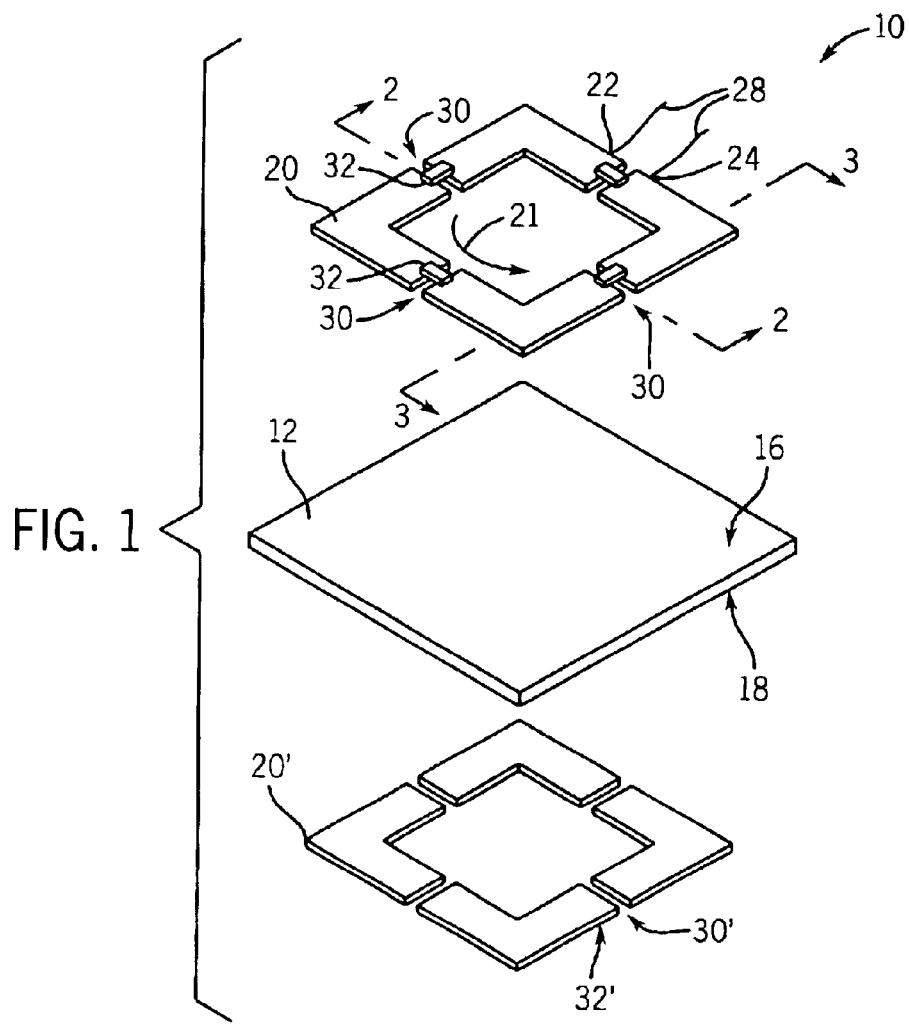
FIG. 1 is an exploded perspective view of a single loop MRI coil joining first and second aligned patterns on opposite sides of an insulating sheet.

Referring now to FIG. 1, a local coil 10 constructed according to the present invention includes a planar insulating substrate 12 such as may be a conventional, flexible, or rigid printed circuit board material having a first and second surface 16 and 18, respectively.

A first conductive pattern 20 of metal foil is attached to the first surface 16 and provides a loop current path terminating at first and second terminals 22 and 24. During use of the local coil 10, terminals 22 and 24 are connected via leads 28 to the input circuitry of a standard magnetic resonance imaging (MRI) system.

The first conductive pattern 20 is broken periodically by gaps 30 bridged by tuning capacitors 32 to provide a series resonant circuit tuned to the desired Larmor frequency as is generally understood in the art.

A similar second conductive pattern 20' is attached to the reverse surface 18 of the insulating substrate 12 and aligned with first conductive pattern 20. In this respect, the second conductive pattern 20 may have corresponding gaps 30' bridged by corresponding capacitors 32' (visible in FIG. 3).

Alternatively, in a simpler embodiment, the capacitors 32' and gaps 30' may be omitted.

In the preferred embodiment, the first and second conductive patterns 20 and 20' are formed using printed circuit techniques operating on standard printed circuit board material. Such standard material may include a substrate 12 of epoxy-fiberglass, for example, clad on the front and rear surface with a continuous layer of copper foil. Standard thicknesses of copper foil useful for the present invention are one or two ounces of copper per square foot. In one subtractive technique, the copper foil is coated with a photo resist that is selectively treated by light passing through a mask defining the first and second conductive patterns 20 and 20'. Photo resist outside of the first and second conductive patterns 20 and 20' is removed and an etchant applied to remove the copper in that area. Precise first and second conductive patterns 20 and 20' may thus be easily reproduced.

Alternatively, the copper can be removed by a milling cutter operating under computer control, or copper can be selectively applied by additive printed circuit board processing techniques, both well known in the art.

Figure 2:
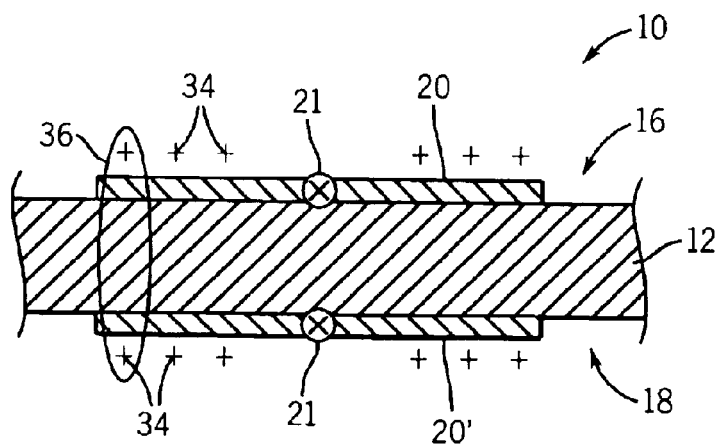
FIG. 2 is a cross-sectional view of the coil of FIG. 1 showing what is believed to be an improved distribution of charge during current flow caused by the opposed plates of the first and second conductors of FIG. 1.

Referring now to FIG. 2, the proximity and orientation of first and second conductive patterns 20 and 20' will cause high frequency current flow 21 on the local coil 10 to be shared between the first and second conductive patterns 20 and 20'. This will be true even without a direct current passing conductor connecting the first and second conductive patterns 20 and 20'. The effect of this division of current flow is to increase the effective cross-section of conductor, lowering resistance to current flow and increasing the Q of the local coil 10.

As is understood in the art, charge 34 forming the high frequency current flow 21 tends to move toward edges of the conductive patterns 20 and 20'. This concentration of charge 34 increases the effective resistance of the first and second conductive patterns 20 and 20'. Although the inventors do not wish to be bound by a particular theory, it is believed that the electric field 36 from mirror image charges 34, near the edge of the aligned first and second conductive patterns 20 and 20', create a mutual repulsion that resists this edge charge build up. The resulting more uniform current flow further lowers the effective resistance of the first and second conductive patterns 20 and 20' beyond the effect obtained simply by current sharing.

Figure 3:
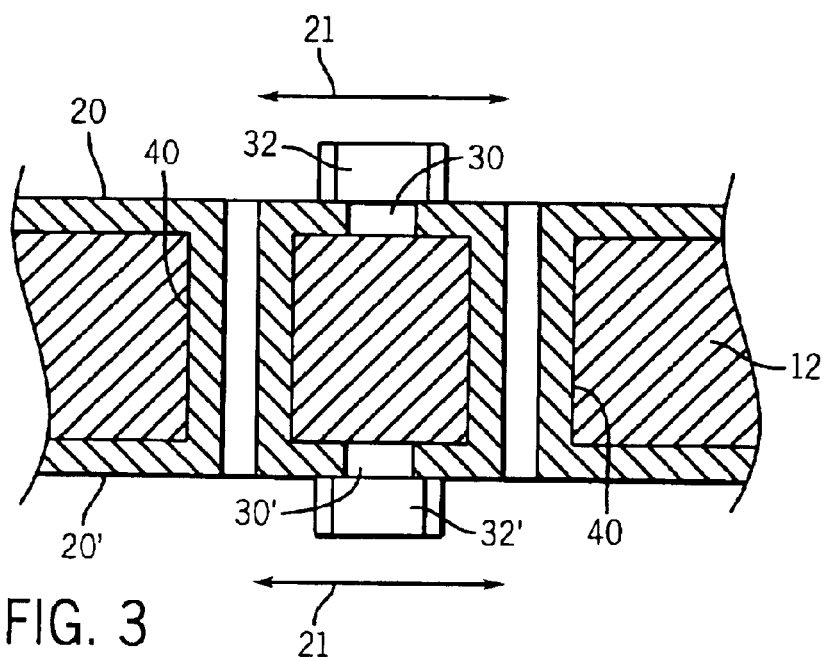
FIG. 3 is a cross-sectional view along lines 3—3 of FIG. 1 showing the introduction of series capacitances into the loops of the first and second conductive patterns and showing the connection of the first and second patterns through the insulating substrate through the use of plate through holes.

Referring now to FIG. 3, in an alternative embodiment, gaps 30 and 30' bridged by capacitors 32 and 32' may be flanked by plate-through holes 40 on opposite sides of the capacitors 32 and 32'. Capacitor 32 bridges first conductive pattern 20 across gap 30 and capacitor 32' bridges second conductive pattern 20' across gap 30'. The plate through holes 40 connectively bridge the first and second conductive patterns 20 and 20'. Additionally, the plate through holes 40 also provide a direct current passing path (i.e., a short circuit) between the first and second conductive patterns 20 and 20', ensuring that the voltage at these points on both of the first and second conductive patterns 20 and 20' are equal and improve current sharing.

The plate through holes 40 may be manufactured using normal printed circuit techniques as are well known in the art and eliminated the need for auxiliary wiring to make this connection. Alternatively, other methods of joining the first and second conductive patterns 20 and 20' may be used including wires, rivets and the like.

Figure 4:
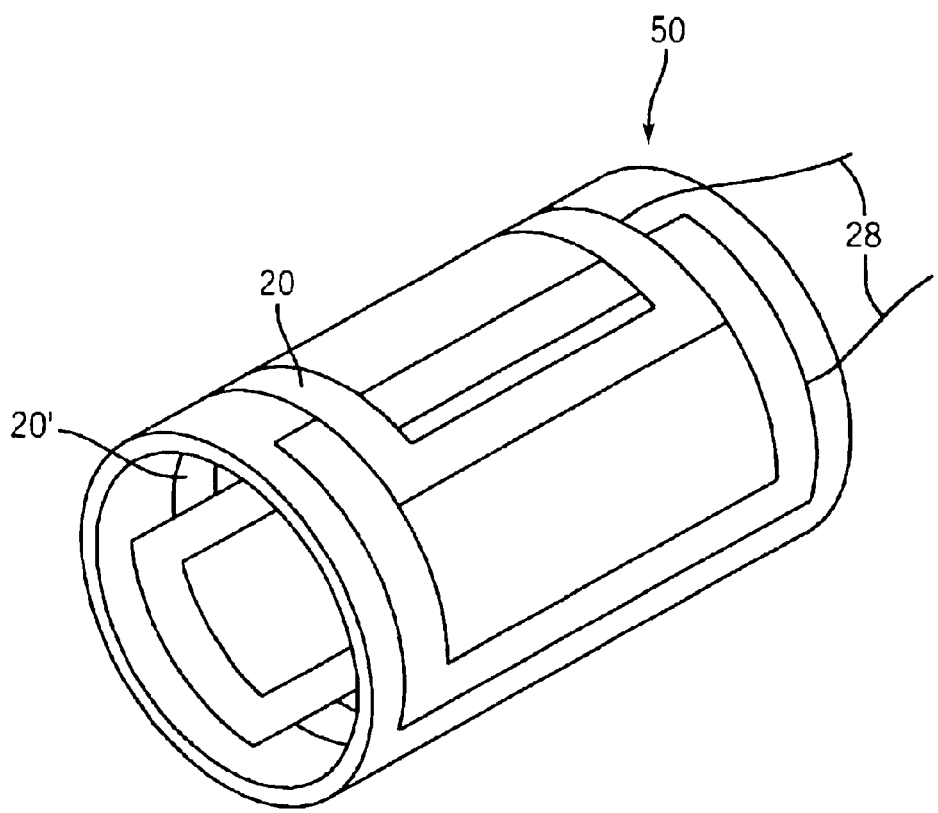
FIG. 4 is a perspective view of a simplified tubular local coil showing positioning of multiple loops on the inside and outside of the coil as may implement the present invention in a non-planar form.

Referring to FIG. 4, the insulating substrate 12 may be a rigid or a flexible material and may be formed into non-planar sheets, for example, into a cylindrical tube 50. In this case, the first and second conductive patterns 20 and 20' will be matching loops opposed on the outside and inside of the tube 50, respectively. The tubular shape is useful for the production of certain phased array, quadrature, and birdcage coils as is understood in the art.

It will be understood that the principle of the present invention may be extended to matching patterns separated by insulating layers in multi-layer circuit boards and, that the first and second conductive patterns 20 and 20' need not be precisely identical so long as they function in unison to share currents induced by the NMR signal from a single volume of interest. It is specifically intended that the present invention not be limited to the embodiments and illustrations contained herein, but include modified forms of those embodiments including portions of the embodiments and combinations of elements of different embodiments as come within the scope of the following claims.

We claim:

1. A method of configuration of an RF local MRI coil which images the human body comprising the steps of:

(a) forming a first conductive pattern on a front surface of the insulating substrate to provide a resonant antenna sensitive to NMR signals;

(b) forming a second conductive pattern on a rear surface of the insulating substrate in alignment with the first conductive pattern over substantially the entire area of the second conductive pattern where the second conductive pattern is a substantial duplicate of the first conductive pattern;

(c) attaching signal terminals to the first conductive pattern to conduct an NMR signal to an MRI machine for processing; and (d) joining the conductive patterns by a plurality of direct-current passing conductors through holes in the insulating substrate wherein the conductors provide a direct short circuit between the first conductive pattern and the second conductive pattern.

2. The method of configuration of claim 1 wherein steps (a) and (b) are performed by etching copper foil adhered to the front and rear surfaces of the insulating substrate.

3. An RF local MRI coil which images the human body comprising:

an insulating substrate having a front and rear surface;

a first conductive pattern formed of metal foil adhered to the front surface of the insulating substrate that provides a resonant antenna sensitive to NMR signals;

signal terminals formed on the first conductive pattern, which conduct an NMR signal to an MRI machine for processing;

a second conductive pattern formed of metal foil adhered to the rear surface of the insulating substrate in alignment with the first conductive pattern over substantially an entire area of the second conductive pattern where the second conductive pattern is a substantial duplicate of the first conductive pattern;

wherein the second conductive pattern electrically couples the first electrical pattern reducing the effective resistance of the first electrical pattern; and wherein the first and second conductive patterns are joined by direct-current passing conductors through holes in the insulating substrate at a plurality of locations, wherein the conductors provide a direct short circuit between the first conductive pattern and the second conductive pattern.

4. The MRI coil of claim 3 wherein the insulating substrate is flexible.

5. The MRI coil of claim 3 wherein the first and second conductive patterns are etched from copper foil adhered to the front and rear surface of the insulating substrate.

6. The MRI coil of claim 5 wherein the copper foil has a weight of substantially 1 to 2 ounces per square foot.

7. The MRI coil of claim 3 wherein the insulating substrate is planar.

8. The MRI coil of claim 3 wherein the first and second conductive patterns are loops.

9. The MRI coil of claim 3 wherein the insulating substrate is in the form of a cylindrical tube.

10. The MRI coil of claim 3 wherein the direct current passing conductors through holes in the insulating substrate comprise plate-through holes.

* * * * *